(12) United States Patent
Farwell et al.

(10) Patent No.: US 6,324,664 B1
(45) Date of Patent: Nov. 27, 2001

(54) MEANS FOR TESTING DYNAMIC INTEGRATED CIRCUITS

(75) Inventors: William D. Farwell, Thousand Oaks; Robert L. Stokes, Redondo Beach, both of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/238,112

(22) Filed: Jan. 27, 1999

(51) Int. Cl.[7] .................................................... G01R 31/28
(52) U.S. Cl. ............................................................ 714/726
(58) Field of Search ....................................... 714/726–733

(56) References Cited

U.S. PATENT DOCUMENTS

| | | | |
|---|---|---|---|
| 4,764,926 | 8/1988 | Knight et al. | 714/733 |
| 4,894,830 * | 1/1990 | Kawai | 714/731 |
| 5,003,204 | 3/1991 | Cushing et al. | 324/40 |
| 5,043,986 | 8/1991 | Agrawal et al. | 714/736 |
| 5,132,974 | 7/1992 | Rosales | 714/731 |
| 5,181,191 | 1/1993 | Farwell | 368/113 |
| 5,202,625 | 4/1993 | Farwell | 714/727 |
| 5,239,262 * | 8/1993 | Grutzner et al. | 714/733 |
| 5,337,321 | 8/1994 | Ozaki | 714/731 |
| 5,381,420 * | 1/1995 | Henry | 714/731 |
| 5,504,756 | 4/1996 | Kim et al. | 714/729 |
| 5,524,114 | 6/1996 | Peng | 714/724 |
| 5,563,507 | 10/1996 | Farwell | 324/158.1 |
| 5,708,380 | 1/1998 | Farwell | 327/202 |
| 5,717,702 | 2/1998 | Stokes et al. | 714/730 |
| 5,774,475 * | 6/1998 | Qureshi | 714/726 |
| 5,983,377 * | 11/1999 | Knotts | 714/726 |
| 6,073,261 * | 6/2000 | Miller | 714/731 |

* cited by examiner

*Primary Examiner*—Albert DeCady
*Assistant Examiner*—Shelly A Chase
(74) *Attorney, Agent, or Firm*—Leonard A. Alkov; Glenn H. Lenzen, Jr.

(57) ABSTRACT

A test circuit that includes a scan path having serially coupled scan flip-flops clocked by a system clock signal, an index counter clocked by the system clock for providing an index output for tracking data in the scan path, a control circuit clocked by a test clock signal for receiving scan input data from an external source and for providing output data to the external source, an input memory for receiving scan input data from the control circuit, an output memory for receiving the output of the scan path, and a selection circuit having a first input for receiving the output of the scan path, a second input for receiving scan input data from the input memory, and an output connected to the input of the scan path.

16 Claims, 2 Drawing Sheets

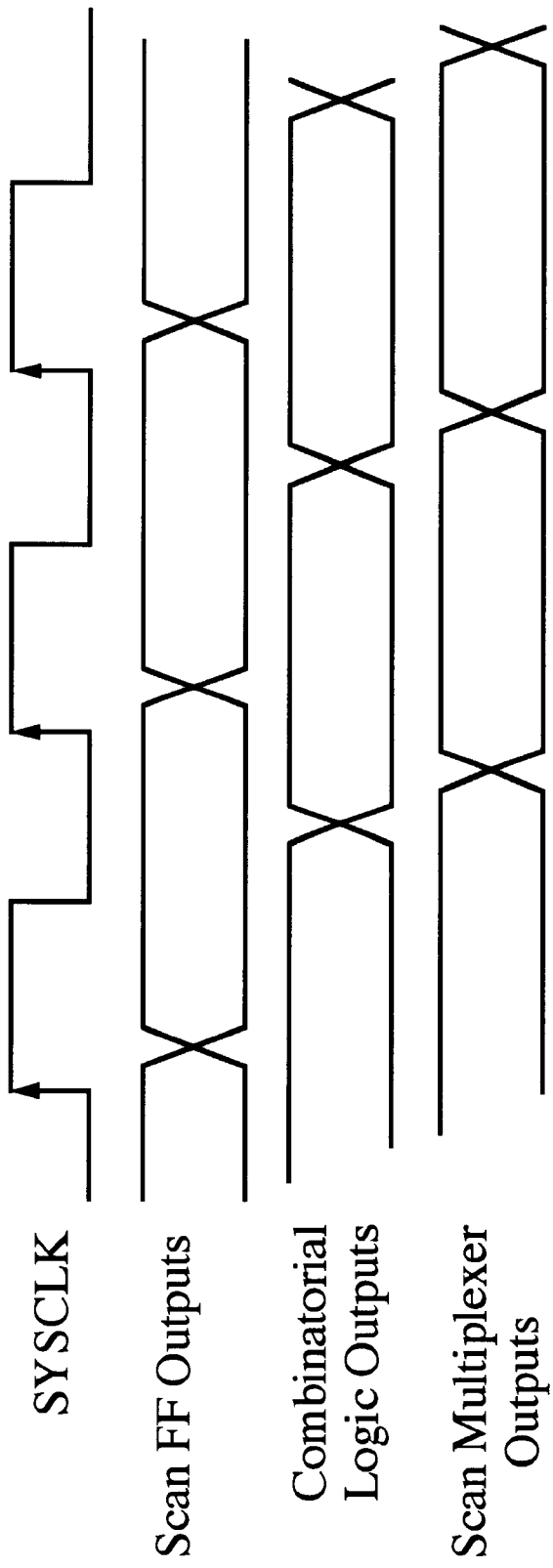

… (US 6,324,664 B1)

MEANS FOR TESTING DYNAMIC INTEGRATED CIRCUITS

TECHNICAL FIELD OF THE INVENTION

The disclosed invention generally relates to scan path testing circuitry, and more particularly to scan path testing circuitry for applications wherein the system clock frequency is constant and uninterrupted while the test clock from external test equipment may be of a different frequency, asynchronous or discontinuous relative to the system clock.

BACKGROUND OF THE INVENTION

Digital integrated circuit devices often employ special circuits to aid testability so as to make the operation of testing a digital device simpler, more efficient and more effective.

A very common built-in test circuit is a scan path or chain by which the bistable elements (flip-flops and/or latches) within a digital device are connected into a shift register called a scan path or scan chain. With the digital device in scan mode, an input pattern is serially scanned into the bistable elements (i.e., serially shifted into the bistable elements). The digital device is then operated in the normal mode for one clock period, which causes the bistable element contents to act as inputs to the internal combinatorial logic, and causes subsequent response values to be stored in the bistable elements. The digital device is again placed in the scan mode to allow the response pattern stored in the bistable elements to be serially scanned out (i.e., serially shifted out) and compared with the correct response.

In the scan mode, input patterns are provided by external test equipment which also receives the response patterns shifted out of the storage elements of a scan path. Typically, the input patterns and response patterns are communicated over a common serial test bus, as for example specified by the IEEE Standard 1149.1 for a Standard Test Access Port. Often the serial scanning by the external test equipment must be performed at a test clock frequency that is different from and/or asynchronous relative to the system clock frequency at which the device under test performs its operational functions. Also, the test clock could be discontinuous.

As a result of these characteristics of the test clock frequency of test equipment, ASICs typically do not use dynamic logic, which is characterized by the need to be continuously refreshed, for example by receipt of a clock pulse at a minimum specified rate, in order to maintain data stored in memory. The advantage of dynamic logic include smaller size, lower power, and higher speed performance as compared to static logic (in which the last memory state is held indefinitely long in the absence of a clock).

U.S. Pat. No. 5,181,191, W.D. Farwell, describes a technique for testing integrated circuits (ICs) at higher clock speeds than the clock speed provided by test equipment. This supports a known technique for testing dynamic logic of ensuring that the chip clock meet a maximum clock-to-clock period. However, this technique requires that the test clock and chip clock be synchronously related, and cannot be done at all for some forms of external test equipment.

There is accordingly a need for a scan test circuit that employs a continuous system clock and a test clock that can be discontinuous and/or asynchronous.

SUMMARY OF THE INVENTION

The subject invention is a test circuit that includes a scan path having serially coupled scan flip-flops that are clocked by a system clock signal, an index counter clocked by the system clock for providing an index output for tracking data in the scan path, a control circuit clocked by a test clock signal for receiving scan input data from an external source and for providing output data to the external source, an input memory for receiving scan input data from the control circuit, an output memory for receiving the output of the scan path, and a selection circuit having a first input for receiving the output of the scan path, a second input for receiving scan input data from the input memory, and an output connected to the input of the scan path. The selection circuit is responsive to the control circuit for providing a selection circuit output that comprises (a) a replica of the $i^{th}$ scan input data bit when the $i^{th}$ scan input data bit is available at the input memory and the index counter indicates that the $i^{th}$ scan input data is ready for receipt into the scan path, and (b) otherwise a replica of the output of the scan path. The control circuit further samples the output memory.

In accordance with a more specific aspect of the invention the scan flip-flops of the scan path comprise dynamic logic. The disclosed invention advantageously allows for the testing of dynamic logic in ASICs and other ICs with simple test equipment which may not be otherwise designed to support dynamic testing.

BRIEF DESCRIPTION OF THE DRAWINGS

The advantages and features of the disclosed invention will readily be appreciated by persons skilled in the art from the following detailed description when read in conjunction with the drawing wherein:

FIG. 2 is a timing diagram illustrating logic transition timing of logic signals of the test circuit of FIG. 1.

DETAILED DESCRIPTION OF THE PREFERRED EMBODIMENTS

Figure 1:
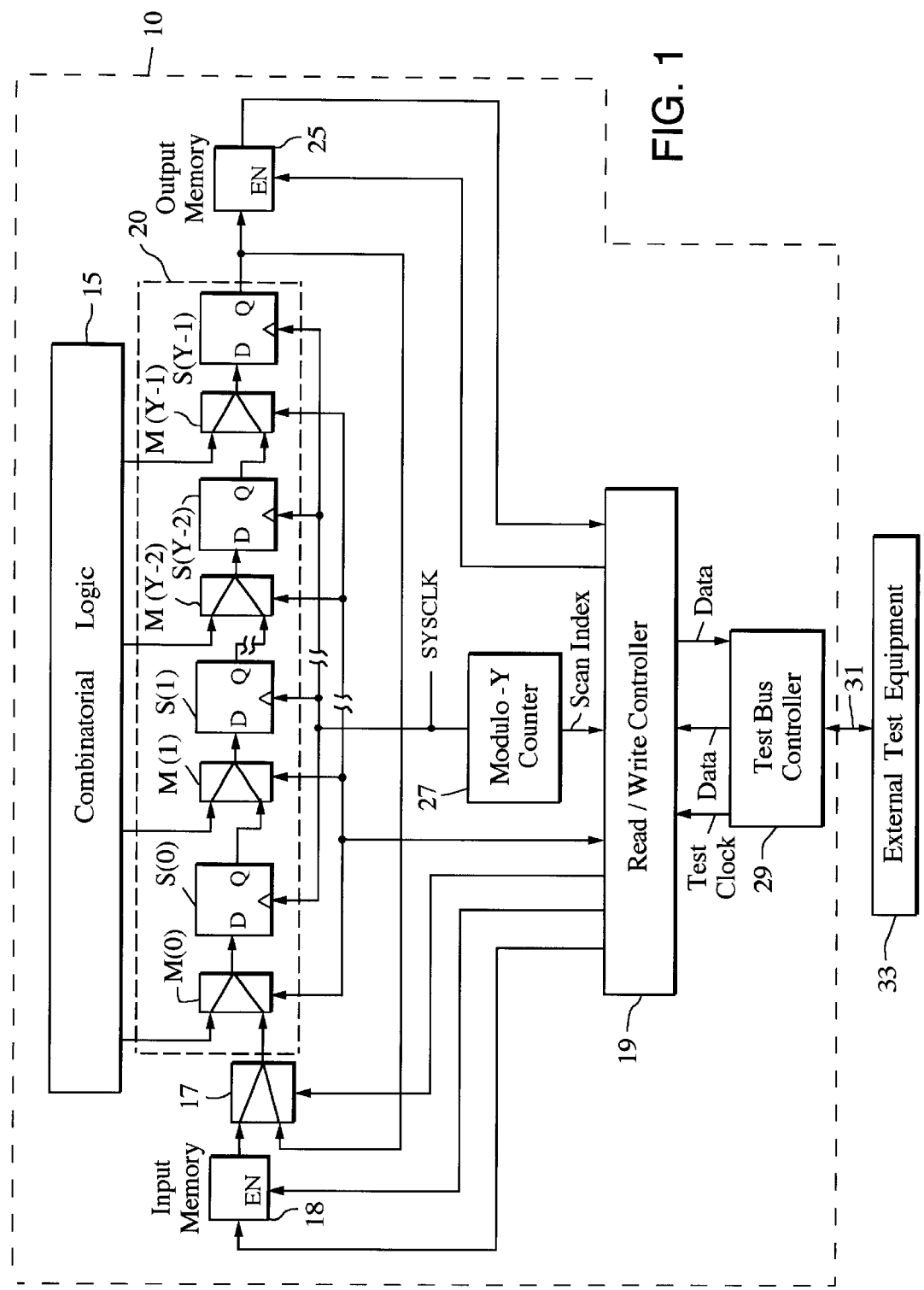
FIG. 1 is a schematic block diagram of an embodiment of a test circuit in accordance with the invention.

In the following detailed description and in the several figures of the drawing, like elements are identified with like reference numerals.

FIG. 1 is a schematic block diagram of an integrated circuit 10 that includes a scan path test circuit in accordance with aspects of the invention. The test circuit includes a scan path 20 comprised of a sequence of Y scan flip-flops S(0) through S(Y−1) which are clocked by a continuous system clock signal SYSCLK, and are serially coupled via scan multiplexers M(0) through M(Y−1) between the output of a 2-to-1 input multiplexer 17 and the input of an output memory 25. In particular, each of the Y scan flip-flops S(0) through S(Y−1) includes a D input and a Q output, and the outputs of the scan multiplexers M(0) through M(Y−1) are respectively connected to respective D inputs of the scan flip-flops S(0) through S(Y−1).

The system clock signal SYSCLK can be internally generated on the integrated circuit 10, or it can alternatively be externally provided.

The 1 inputs of the scan multiplexers M(0) through M(Y−1) are connected to combinatorial logic 15 which is clocked with the system clock SYSCLK. The 0 input of the scan multiplexer M(0) is connected to the output of the 2-to-1 input multiplexer 17, while the 0 inputs of the scan multiplexers M(l) through M(Y−1) are respectively connected to the respective Q outputs of the scan flip-flops S(0) through S(Y−2). The Q outputs of the scan flip-flops S(0) through S(Y−1) are further connected to the combinatorial logic 15.

Pursuant to an aspect of the invention, the scan flip-flops S(0) through S(Y−1) and flip-flops or registers in the combinatorial logic 15 advantageously comprise dynamic logic in this exemplary embodiment.

The scan chain 20 is controlled to operate in a serial mode or a parallel mode by switching the scan multiplexers M(0) through M(Y−1) which are controlled by a read/write controller 19. In particular, the serial mode of operation is selected by switching the scan multiplexers to observe the output of the input multiplexer 17 and the outputs of the scan flip-flops, respectively, whereby the outputs of the scan multiplexers M(0) through M(Y−1) are respective replicas of the output of the input multiplexer 17 and the outputs of the scan flip-flops S(1) through S(Y−2), respectively. The parallel or functional mode of operation is selected by switching the scan multiplexers to observe the outputs of the combinatorial logic 15, whereby the outputs of the scan multiplexers M(0) through M(Y−1) are replicas of the outputs of the combinatorial logic 15.

When the scan chain is in the serial mode, data is serially shifted through the scan flip-flops S(0) through S(Y−1). When the scan chain is in the parallel or functional mode, data is transferred from the combinatorial logic 15 to the scan-flip flops S(1) through S(Y−1) which in the parallel or functional mode function as conventional non-serially connected flip-flops having outputs connected to the combinatorial logic 15.

Referring now to the logic transition timing diagram of FIG. 2, the scan flip-flops continuously source input states to the combinatorial logic 15 which produces outputs as a function of these input states, where such outputs are inputs to the scan multiplexers M(0) through M(Y−1). These outputs can be observed by placing the scan chain in the parallel mode wherein the scan multiplexers M(0) through M(Y−1) are switched to provide replicas of the combinatorial outputs at the inputs to the scan flip-flops S(0) through S(Y−1). While such replicas are delayed, they are available at the scan flip-flop inputs prior to the clock edge that follows the clock edge that caused the scan flip-flops to output the inputs to combinatorial logic that caused such combinatorial logic outputs. Thus, the transfer through the combinatorial logic 15 occurs in a single cycle of the clock signal SYSCLK and, if desired, the scan chain can be controlled to provide inputs to the combinatorial logic 15 and sample resulting outputs from the combinatorial logic, all in one clock cycle. The frequency of SYSCLK is preferably selected to be sufficiently low to allow propagation delay within one clock cycle.

The output of the (Y−1)$^{th}$ scan flip-flop S(Y−1) is connected to the 0 input of the 2-to-1 input multiplexer 17 which has its 1 input connected to an output of an input memory 18 which in turn has an input connected to an output of the read/write controller 19 that provides input test data to the input memory 18. The read/write controller 19 selectively enables the input memory 18 as described further herein. By way of illustrative example, the input memory 18 comprises a one-bit memory element.

The output of the (Y−1)$^{th}$ scan flip-flop (Y−1) is further connected to the output memory 25 which is selectively enabled by the read/write controller 19 which further receives output data from the output memory 25. In an exemplary embodiment, the output memory 25 comprises a one-bit memory element.

A modulo-Y counter 27 is clocked by the continuous system clock signal SYSCLK and provides a modulo-Y count output as a scan index to the read/write controller 19.

A conventional test bus controller 29 is connected between the read/write controller 19 and a test bus 31 that is connected to external test equipment 33. The test bus controller 29 provides data and control communications between the read/write controller 19 and the external test equipment 33. In particular, the test bus controller 29 provides a TEST CLOCK signal and input data to the read/write controller 19, and receives output data from the read/write controller 19.

The output of the modulo-Y counter 27 is indicative of the index of the bit that can be received at the input of the scan path 20 and of the index of the bit that is at the output of the scan path 20. In particular, the modulo-Y counter tracks the locations of the input data bits and the output data bits in the scan path 20, such that input data bits are inserted at appropriate times into the scan flip-flip flop Y(0) and output data bits are sampled at appropriate times into the output memory 25.

In an exemplary embodiment, the input multiplexer 17, the input memory 18, the output memory 25, the modulo-Y counter 27, the read/write controller 19, and the test bus controller 29 are implemented in the integrated circuit 10 together with the combinatorial logic 15 and the scan path 20.

In operation, the scan path 20 and the combinatorial logic 15 are clocked by the continuous system clock signal SYSCLK. Data is inserted into the scan path 20 and sampled from the scan path 20 by tracking the locations of the data in the scan path 20 via the modulo counter 27, buffering input data in the input memory 18, and controlling the input multiplexer 17.

The particular operation of the test circuit can be readily understood by first considering steady state operation wherein the scan path 20 contains test output data that was transferred thereto from the combinatorial logic 15. Initial loading of the test data would be accomplished by not sampling or ignoring the data at the output of the scan path 20.

When the index counter indicates that the output bit i=0 is at the output of the scan path 20 (i.e., at the output of the scan flip-flop S(Y−1)), the output memory 25 is enabled to sample the output of the scan path 20, and a flag is set to indicate that valid output data is in the output memory 25.

At the TEST CLOCK rate, the test bus controller 27 reads the output memory 25, sends input bit i=0 to the input memory 18, and enables the input memory 18 to store the bit i=0, all of which can occur simultaneously.

When the index counter 27 indicates that input bit i=0 is ready to be received at the input of the scan path 20, the input multiplexer 17 is controlled for one system clock cycle to provide the bit i=0 of the input memory 18 to the scan path 20, overwriting the previous output bit i=0 which has already been sampled. The input multiplexer 17 is returned to recirculate mode on the next clock after the input data bit i=0 is inserted in the scan path.

The foregoing sequence is repeated for each of the remaining output bits and input bits, wherein the input multiplexer 17 is controlled to observe the output of the input memory 18 only when an input data bit is ready to be received at the input to the scan path 20 via the scan multiplexer M(0).

When the input bit is bit i=(Y−1), which is the last input bit of a given test word or vector, the scan path is operated in the parallel mode on the immediately next system clock cycle following the insertion of the (Y−1)$^{th}$ bit into the scan path. The scan path is then returned to the serial mode to scan out the contents of the scan flip-flops S(0) through S(Y−1) and if desired to input new scan data. Alternatively, depending on the purpose of inserting scan inputs and sampling scan outputs, the scan path can be maintained in the parallel mode for any number of system clock cycles.

The following table sets forth the operation of the modulo counter that indicates the bit available for sampling by the output memory 25 as well the bit which can be inserted from the input memory 18, for the simplified example of a scan path that is 5 bits long (which is much shorter than an actual implementation), and for the particular example of sampling and inserting bit 2 of data bits identified as bits 0 through 4. In this example, the modulo counter 27 comprises a modulo 5 counter that cycles from 0 to 4, rolls over to 0 again, and continues the count, and the control input to the input multiplexer 17 is controlled to insert a new bit 2 (identified by an underscore) at the appropriate clock cycle. The heading INPUT MUX CONTROL refers to the control input to the input multiplexer 17.

| SYSCLK CYCLE | INPUT MUX CONTROL | DATA IN SCAN CHAIN | | | | | MODULO COUNTER |
|---|---|---|---|---|---|---|---|
| | | S(0) | S(1) | S(2) | S(3) | S(4) | |
| 0 | 0 | 4 | 3 | 2 | 1 | 0 | 0 |
| 1 | 0 | 0 | 4 | 3 | 2 | 1 | 1 |
| 2 | 1 | 1 | 0 | 4 | 3 | 2 | 2 |
| 3 | 0 | 2 | 1 | 0 | 4 | 3 | 3 |
| 4 | 0 | 3 | 2 | 1 | 0 | 4 | 4 |
| 5 | 0 | 4 | 3 | 2 | 1 | 0 | 0 |
| 6 | 0 | 0 | 4 | 3 | 2 | 1 | 1 |

A scan test circuit has been described that employs a continuous system clock (SYSCLK) and accommodates a test clock (TEST CLOCK) that can be discontinuous or asynchronous relative to the system clock, and advantageously provides for scan testing of an integrated circuit that employs dynamic logic.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A test circuit comprising:
   a scan path including dynamic logic elements clocked by a continuous system clock signal to maintain data states;
   an index counter clocked by the system clock for providing an index output for tracking data in said scan path;
   a control circuit clocked by a test clock signal for receiving scan input data from an external source and for providing scan output data to the external source, said test clock signal being discontinuous or asynchronous relative to said system clock signal;
   an input memory for receiving scan input data from said control circuit; and
   a selection circuit controlled by said control circuit and having a first input for receiving the output of said scan path, a second input for receiving scan input data from said input memory, and an output connected to the input of said scan path, the selection circuit controlled by said control circuit to select said first input or said second input to provide the output of the scan path or the scan input data as said input to said scan path.

2. The test circuit of claim 1 wherein said index counter comprises a modulo-Y counter.

3. The test circuit of claim 1 wherein said selection circuit comprises a multiplexer.

4. The test circuit of claim 1 wherein said input memory comprises a one-bit input memory.

5. The test circuit of claim 1 further including:
   an output memory for receiving the output of said scan path; and
   wherein said control circuit further samples said output memory.

6. The test circuit of claim 5 wherein said output memory comprises a one-bit output memory.

7. The test circuit of claim 1 wherein said scan path includes:
   Y scan flip-flops, each having an input and an output, coupled serially in a sequence from a $0^{th}$ scan flip-flop to a $(Y-1)^{th}$ scan flip-flop; and
   Y scan multiplexers arranged in sequence from a $0^{th}$ scan multiplexer to a $(Y-1)^{th}$ scan multiplexer respectively providing inputs to respective scan flip-flops, and respectively receiving the output of said selection circuit and the outputs of the $0^{th}$ through $(Y-2)^{th}$ scan flip-flops, said Y scan multiplexers further receiving outputs of a combinatorial logic.

8. The test circuit of claim 1 wherein said scan path, said index counter, said control circuit, said input memory and said selection circuit comprise an integrated circuit.

9. An integrated circuit device, comprising:
   combinatorial logic circuitry; and
   a test circuit coupled to the combinatorial logic circuitry, the test circuit comprising:
   a scan path coupled to the combinatorial logic circuitry, said scan path and said combinatorial logic circuitry clocked by a continuous system clock signal;
   said scan path comprising dynamic logic elements clocked by said continuous system clock signal to maintain data states;
   an index counter clocked by the system clock for providing an index output for tracking data in said scan path;
   a control circuit clocked by a test clock signal for receiving scan input data from an external source and for providing scan output data to the external source, said test clock signal being discontinuous or asynchronous with respect to said system clock signal;
   an input memory for receiving scan input data from said control circuit; and
   a selection circuit having a first input for receiving the output of said scan path, a second input for receiving scan input data from said input memory, and an output connected to the input of said scan path, said selection circuit controlled by said control circuit for dynamically selecting said output of said scan path or said scan input data from said input memory as the input to said scan path.

10. The device of claim 9 wherein said index counter comprises a modulo-Y counter.

11. The device of claim 9 wherein said selection circuit comprises a multiplexer.

12. The device of claim 9 wherein said input memory comprises a one-bit input memory.

13. The device of claim 9 further including:
   an output memory for receiving the output of said scan path; and
   wherein said control circuit further samples said output memory.

14. The device of claim 13 wherein said output memory comprises a one-bit output memory.

15. The device of claim 9 wherein said scan path includes:
   Y scan flip-flops, each having an input and an output, coupled serially in a sequence from a $0^{th}$ scan flip-flop to a $(Y-1)^{th}$ scan flip-flop; and
   Y scan multiplexers arranged in sequence from a $0^{th}$ scan multiplexer to a $(Y-1)^{th}$ scan multiplexer respectively providing inputs to respective scan flip-flops, and respectively receiving the output of said selection circuit and the outputs of the $0^{th}$ through $(Y-2)^{th}$ scan flip-flops, said Y scan multiplexers further receiving outputs of said combinatorial logic circuitry.

16. A test circuit for testing combinatorial logic, comprising:
   a scan path including dynamic logic elements clocked by a continuous system clock signal to maintain data states;
   an index counter clocked by the system clock for providing an index output for tracking data in said scan path;
   a control circuit clocked by a test clock signal for receiving scan input data from an external source and for providing scan output data to the external source;
   an input memory for receiving scan input data from said control circuit;
   a selection circuit having a first input for receiving the output of said scan path, a second input for receiving scan input data from said input memory, and an output connected to the input of said scan path, the selection circuit controlled by the control circuit to select as the selection circuit output the output of the scan path or the scan input data from said input memory; and wherein
   said dynamic logic elements of said scan path comprise Y scan flip-flops, each having an input and an output, coupled serially in a sequence from a $0^{th}$ scan flip-flop to a $(Y-1)^{th}$ scan flip-flop, said scan path further comprising Y scan multiplexers arranged in sequence from a $0^{th}$ scan multiplexer to a $(Y-1)^{th}$ scan multiplexer respectively providing inputs to respective scan flip-flops, and respectively receiving the output of said selection circuit and the outputs of the $0^{th}$ through $(Y-2)^{th}$ scan flip-flops, said Y scan multiplexers further receiving outputs of a combinatorial logic.

* * * * *